(12) United States Patent
Mandelman et al.

(10) Patent No.: US 6,440,788 B2
(45) Date of Patent: Aug. 27, 2002

(54) IMPLANT SEQUENCE FOR MULTI-FUNCTION SEMICONDUCTOR STRUCTURE AND METHOD

(75) Inventors: Jack A. Mandelman, Stormville, NY (US); Edward J. Nowak; William R. Tonti, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/895,159

(22) Filed: Jul. 2, 2001

Related U.S. Application Data

(62) Division of application No. 09/484,198, filed on Jan. 18, 2000, now Pat. No. 6,255,694.

(51) Int. Cl.[7] .............................................. H01L 27/10
(52) U.S. Cl. ........................ 438/204; 438/206; 438/234; 438/202
(58) Field of Search .......................... 257/350, 378; 438/319, 202, 234, 311, 419, 479, 457, 235, 236, 206, 170, 189, 174, 204

(56) References Cited

U.S. PATENT DOCUMENTS

| | | |
|---|---|---|
| 4,050,965 A | 9/1977 | Ipri et al. |
| 4,999,518 A | 3/1991 | Dhong et al. |
| 5,023,690 A | 6/1991 | Verret et al. |
| 5,104,817 A | 4/1992 | Scott |
| 5,171,699 A | 12/1992 | Hutter et al. |
| 5,256,582 A | 10/1993 | Mosher et al. |
| 5,397,905 A | 3/1995 | Otsuki et al. |
| 5,422,502 A | 6/1995 | Kovacic |
| 5,552,624 A | 9/1996 | Skotnicki et al. |
| 5,567,631 A | 10/1996 | Hsu et al. |
| 5,578,856 A | 11/1996 | Subrahmanyan et al. |
| 5,786,622 A | 7/1998 | Ronkainen |
| 5,874,768 A * | 2/1999 | Yamaguchi et al. ........ 257/493 |
| 5,891,776 A * | 4/1999 | Han et al. ................... 438/274 |
| 5,994,739 A * | 11/1999 | Nakagawa et al. ......... 257/350 |
| 6,002,154 A * | 12/1999 | Fujita .......................... 257/349 |
| 6,217,357 B1 * | 4/2001 | Masuoka .................... 439/199 |

* cited by examiner

*Primary Examiner*—Phat X. Cao
*Assistant Examiner*—Thao X Le
(74) *Attorney, Agent, or Firm*—Connolly Bove Lodge & Hutz; Mark Chadurjian

(57) ABSTRACT

A multi-function semiconductor device is provided. The device includes a bipolar transistor and an FET formed in parallel. A semiconductor substrate is provided on an insulating layer. A source/emitter region and a drain region are formed in the semiconductor substrate and border first opposite sides of a body region therebetween. A gate is formed above the substrate between the source/emitter region and the drain region to form an FET having three terminals including the gate, the source/emitter region, and the drain region. A collector region is formed in the substrate abutting the drain region and extending further under the gate and the drain region. A bipolar transistor having three terminals is formed including a base region, the source/emitter, and the collector region. A shortest distance between the collector region and the source/emitter region defines a base width.

12 Claims, 11 Drawing Sheets

IMPLANT SEQUENCE FOR MULTI-FUNCTION SEMICONDUCTOR STRUCTURE AND METHOD

CROSS-REFERENCE TO RELATED APPLICATION

This application is a divisional of U.S. patent application Ser. No. 09/484,198 filed Jan. 18, 2000, now U.S. Pat. No. 6,255,694.

FIELD OF THE INVENTION

The present invention relates to multi-function semiconductor structures and, in particular, a semiconductor structure capable of bipolar and/or field effect transistor function formed using silicon on insulator (SOI) technology.

BACKGROUND OF THE INVENTION

It is known how to produce field effect transistors (FETs) and bipolar transistors which are topologically separated on a semiconductor substrate. In BiCMOS, for example, groups of insulated gate n- and p-channel transistors (CMOS transistor), associated with an npn bipolar transistor, are formed on the same silicon chip. These transistors are arranged side-by-side and completely isolated from one another.

Advances in SOI technology have opened the door to many new device designs for both bipolar and field effect transistors. In SOI, a layer of semiconductor material is formed on a layer of an insulator. The device regions are formed within the semiconductor material overlying the insulator. Therefore, the high junction capacitance associated with bulk silicon technology is significantly decreased with SOI.

The use of SOI has advanced the development of multi-function semiconductor structures. For example, in U.S. Pat. No. 5,552,624 to Skotnicki et al., a multi-function semiconductor structure formed in SOI and exhibiting negative dynamic resistance is described. This structure includes, topologically integrated within the same semiconductor structure, a first semiconductor area capable of forming an insulated gate field effect transistor and a second semiconductor area capable of forming a lateral bipolar transistor. The two areas have a common semiconductor layer in which the channel of the field effect transistor capable of being formed and/or the base current of the bipolar transistor is capable of flowing. These two areas are capable of forming a negative dynamic resistance structure. The dynamic resistance effect is achieved by spreading a depletion region from the gated top surface of the semiconductor layer. This, in turn, increases the base resistance. However, in Skotnicki et al., the source diffusion extends all the way to the back interface between the semiconductor material and the insulator, making it impossible to completely pinch off the connection to, that is isolate, the base. Therefore, a lateral leakage path exists through a portion of the source/drain regions which are not covered by the gate conductor. As a result, the feedback effect is not as pronounced as possible. Additionally, in Skotnicki et al., the gate and source do not overlap. This gated structure thus does not function well as an FET as is claimed in Skotnicki et al., but as a trigger for the negative dynamic resistance.

Thus, there is a need for a multi-function semiconductor structure which can operate as either an FET or a bipolar transistor or as both an FET and bipolar transistor simultaneously.

SUMMARY OF THE INVENTION

A multi-function semiconductor structure in which an FET and a bipolar transistor are formed and methods of forming the same, are provided. A combined FET/bipolar device comprises a semiconductor substrate formed on an insulating layer. A source/emitter region and a drain region are formed in the semiconductor substrate bordering first opposite sides of a body region therebetween. A gate is formed above the substrate between the source/emitter region and the drain region to form an FET having three terminals including the gate, the source/emitter region, and the drain region. A base region is provided in the substrate. A collector region is formed in the substrate abutting the drain region and extending further under the gate than the drain region. This forms a bipolar transistor having three terminals including the base region, the source/emitter region, and the collector region. The shortest distance between the collector region and the source/emitter region defines a base width.

In one method of forming a combined FET/bipolar device, a semiconductor material is provided on an insulator. A gate region is defined on the semiconductor material using a mask. Spacers are formed on the semiconductor material in the gate region and on ends of the mask. One of the spacers is removed and a foot implant is formed in the semiconductor material extending under the gate region. The remaining spacer is removed and a halo, having an opposite conductivity type as the foot implant, is implanted into the semiconductor material.

According to another method of forming a combined FET/bipolar transistor, a semiconductor material is provided on an insulating layer. A collector region formed in the semiconductor material adjacent to the insulating layer. A gate structure is formed on the semiconductor material. Source/emitter and drain regions are formed in the semiconductor material on opposite sides of the gate structure. Halos of an opposite conductivity type as the collector region are formed between the source/emitter region and the collector region and between the drain region and the collector region. A reach through implant of the same conductivity type as the collector region is formed on the drain side of the gate structure to counter-dope the halo and connect the drain region to the collector region.

BRIEF DESCRIPTION OF THE DRAWINGS

The present invention will now be further described in the following pages of specification when taken in conjunction with the attached drawings, in which.

DETAILED DESCRIPTION OF THE INVENTION

The present invention provides a multi-function semiconductor structure and method of forming the same. A bipolar transistor is formed in parallel with a FET resulting in a BiCMOS device. The bipolar transistor and the FET may be used separately or both may be used simultaneously. Additionally, the structure of the present invention allows for the dynamic lowering of a snap back voltage which may be useful in protect devices.

Figure 1:
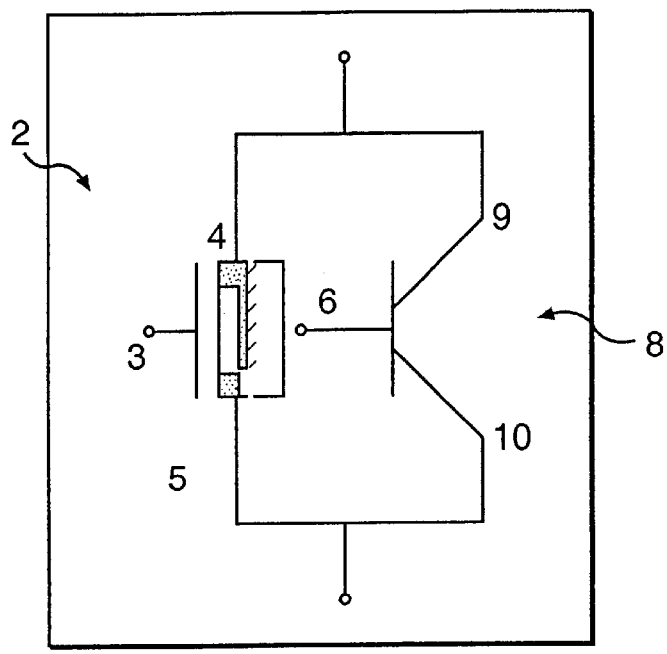
FIG. 1 is a schematic diagram of a combined FET/bipolar device.

A schematic diagram of a combined FET/bipolar device is shown in FIG. 1. The device includes a MOSFET 2 and a bipolar transistor 8. The gate electrode 3 for the FET 2 is an isolated control terminal. The bipolar base (body) 6 contact is formed surrounding the MOSFET active region in a usual manner. The drain 4 of the MOSFET 2 is shared with the collector 9 of the bipolar transistor 8 and the source 5 of the MOSFET 2 is shared with the emitter 10 of the bipolar transistor 8.

Figure 2:
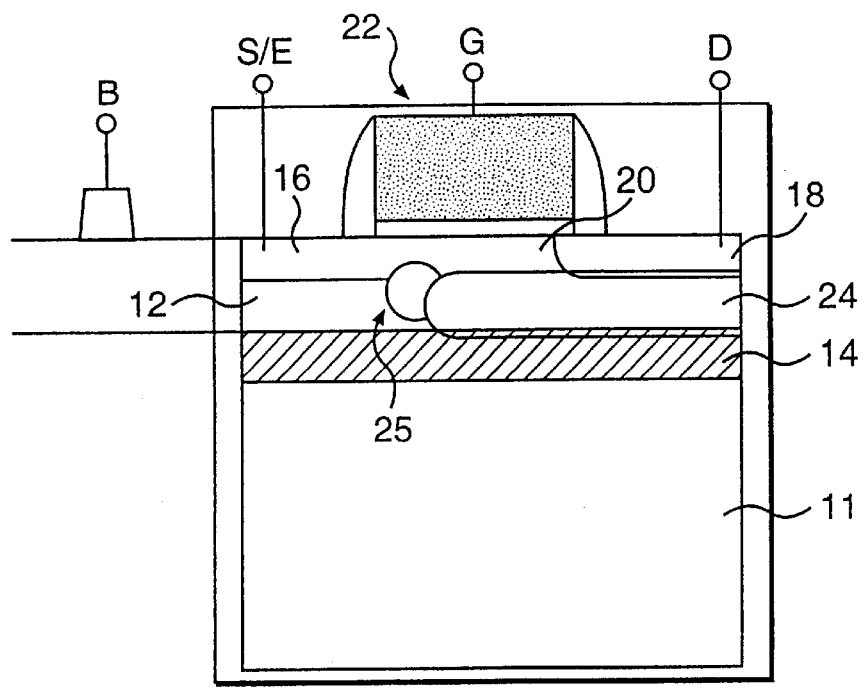
FIG. 2 is a cross section of a semiconductor device according to a first embodiment of the present invention.

A semiconductor structure according to one embodiment of the present invention, and corresponding to the schematic diagram of FIG. 1, is shown in FIG. 2. A layer of semiconductor material 12 is formed on an insulating layer 14. A source/emitter region 16 and a drain region 18 are formed in the semiconductor material 12 with a body or base region 20 therebetween. A gate structure 22 is formed on the surface of the semiconductor material between the source/emitter 16 and drain 18 regions. The source/emitter region 16 and the drain 18 region preferably extend under the gate structure 22. A foot implant 24, serving as a collector of the bipolar transistor, abuts the drain region 18 and extends further under the gate structure 22 than the drain region 18. The shortest distance between the source/emitter region 16 and the collector region 24 defines the base width Wb. A halo 25 having a conductivity type opposite that of the foot, may be formed in the body 22 between the source/emitter 16 and the foot 24. The halo is useful in controlling the bipolar base width, Wb, and the MOSFET threshold voltage Vt. Thus, an FET, having three terminals including the gate 22, the source/emitter region 16, and the drain region 18, is formed in parallel with bipolar transistor also having three terminals including the base region 20, the source/emitter region 16, and the collector 24.

An asymmetric source and drain diffusion is used in FIG. 2 to provide contact on one side of the foot implant 24 between one of the source/emitter region 16 and the drain region 18. An SOI NFET and offset npn structure is shown, thus contact is made between the drain region 18 and the foot implant 24. The source/emitter region 16 is shallower than the depth of the semiconductor material 12. This allows the base region 20 to be partially arranged under the source/emitter region 16. A structure and method not requiring an asymmetric diffusion is also described below. Additionally, the dual SOI PFET and offset pnp exist. The description below is equally applicable to the dual device, with corresponding changes in terminology which are well know to one skilled in the art.

Figure 3A:
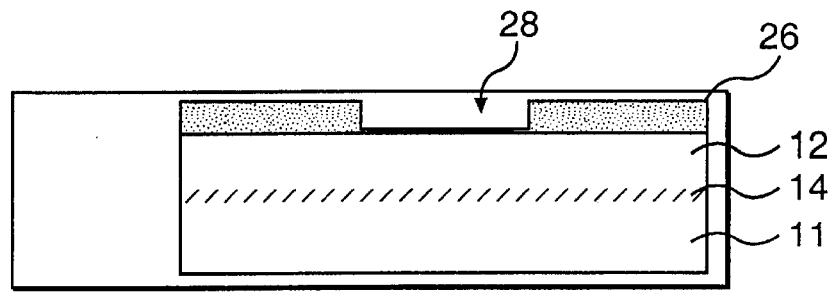
FIGS. 3a–3e illustrate one method of forming a foot and base region.
Figure 3B:
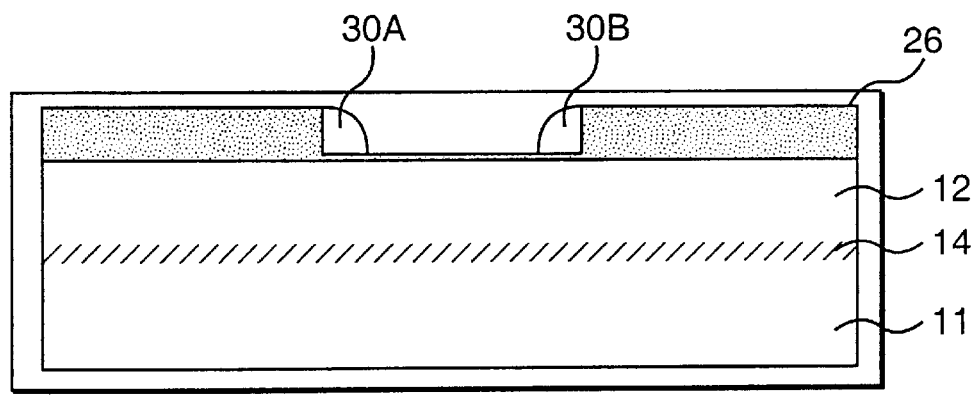
Figure 3C:
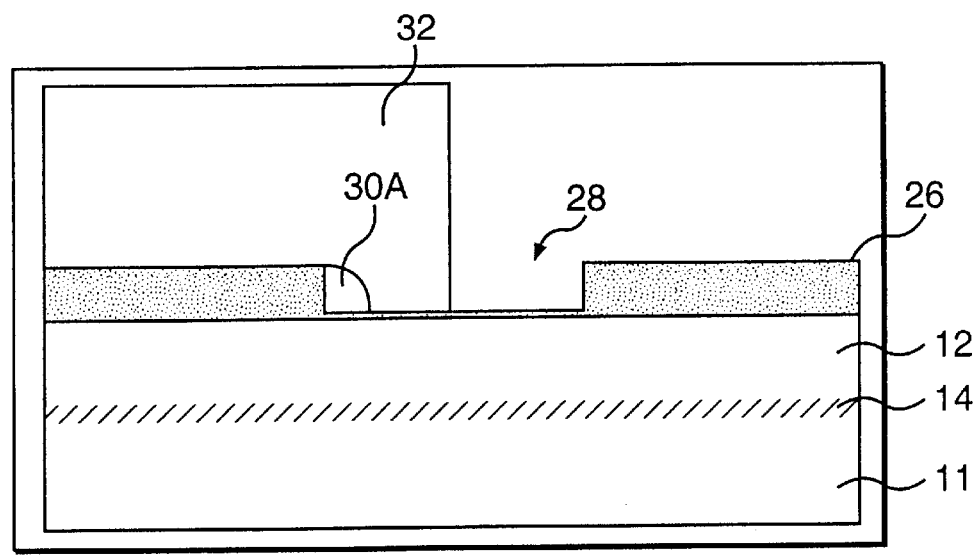

The base width Wb of the device is highly controllable by the process fabrication sequence. Precise base width control may be accomplished using a damascene gate structure where the base is self-aligned to the source/emitter region and has a width defined by a sidewall spacer. A process according to this embodiment of the invention will now be described with reference to FIGS. 3A–3E. FIG. 3A shows a typical SOI substrate including a layer of bulk silicon 11, a layer of insulating material 14, typically an oxide, and a layer of semiconductor material 12, typically silicon. A damascene mask 26 is formed on the semiconductor material 12 to define a gate region 28. The gate region 28 is where the gate structure 22 of the FET will be later formed. Sidewall spacers 30A and 30B are formed on the semiconductor material 12 in the gate region 28 and on ends of the damascene mask 26, as shown in FIG. 3B. An additional mask 32 is formed over one of the sidewall spacers 30A and the other sidewall spacer 30b is removed from one side of the gate region 28 in a known manner as shown in FIG. 3C. To facilitate the removal of the sidewall spacer 30b, the damascene mask 26 may be a hard mask formed from nitride and the sidewall spacers 30A and 30B may be formed from oxide.

Figure 3D:
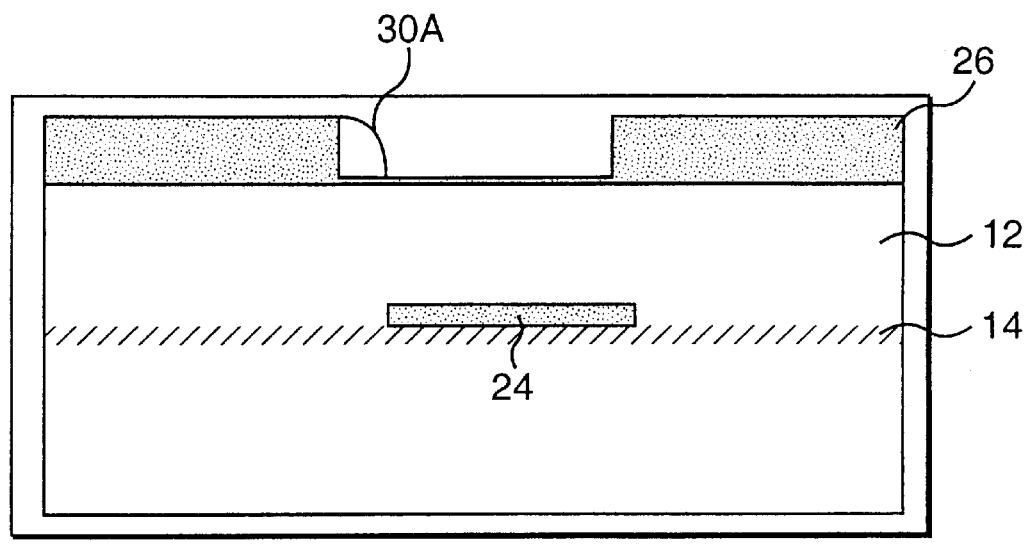
Figure 3E:
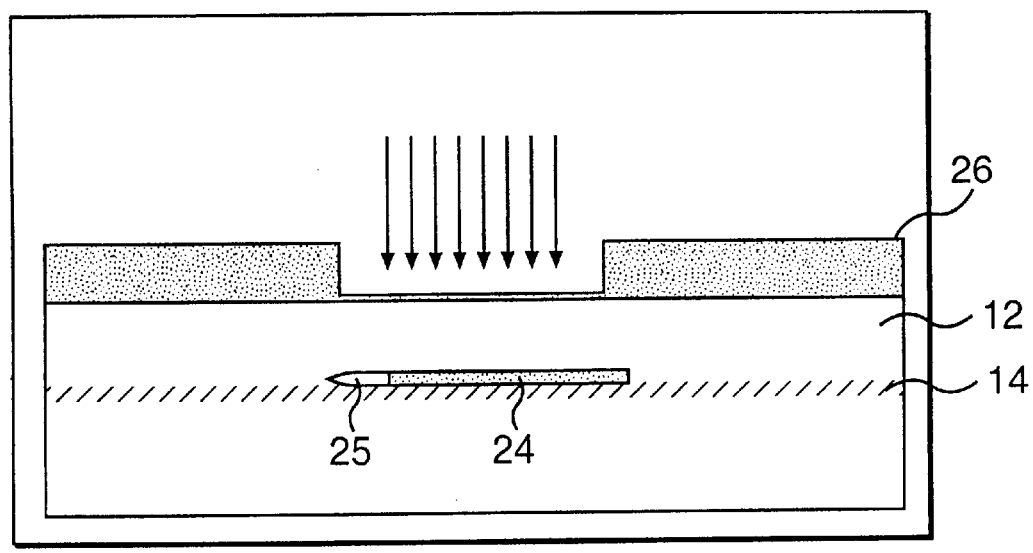

Next, as shown in FIG. 3D, a foot 24 is implanted into the semiconductor material 12 through the gate region 28. The foot 24 is offset from the damascene mask 26 based upon the width of the sidewall spacer 30A. The foot 24 is preferably implanted such that a peak of the foot is arranged at the back interface of the semiconductor material, that is, at the junction between the semiconductor material 12 and the insulating layer 14. The remaining spacer 30A is then removed. FIG. 3E illustrates a blanket implant which may be performed to help define the base width, as well as to provide base width and threshold voltage control. The blanket implant should be of a conductivity type which is opposite that of the foot. As shown in FIG. 3E, the blanket implant is performed through the gate region 28 over the foot implant 24. However, as sidewall spacer 30A was present during the implanting of foot 24, but has been removed before the blanket implant, a halo 25 is formed adjacent to the foot 24. The blanket implant provides a dopant halo in the base width Wb of the bipolar transistor which has an opposite conductivity type as the foot. This halo 25 helps to control punch through between the emitter and the collector of the bipolar transistor. The sidewall spacer 30A is further used to control the width of the base. The wider the spacer, the wider the base width of the bipolar transistor. Why this is so will become clear from the following.

Figure 4:
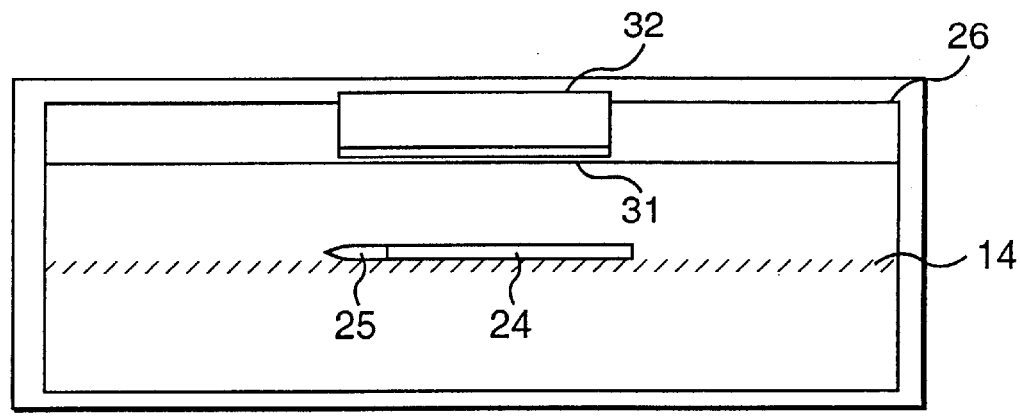
FIGS. 4–7 illustrate additional processes performed in conjunction with the method of FIGS. 3a–3e.

The process may then continue with the source/emitter region, the drain region, and gate structure formed as described below. In FIG. 4, a gate insulator 31 and a gate conductor 32 have been formed on the semiconductor material 12 in the gate region 28. The gate conductor 32 is polished back to the damascene mask 26. The damascene mask 26 is then etched to expose the semiconductor layer 12 in the areas outside of the gate region 28 in a known manner. Also, sidewall spacers may be formed on the gate conductor in a known manner.

Figure 5:
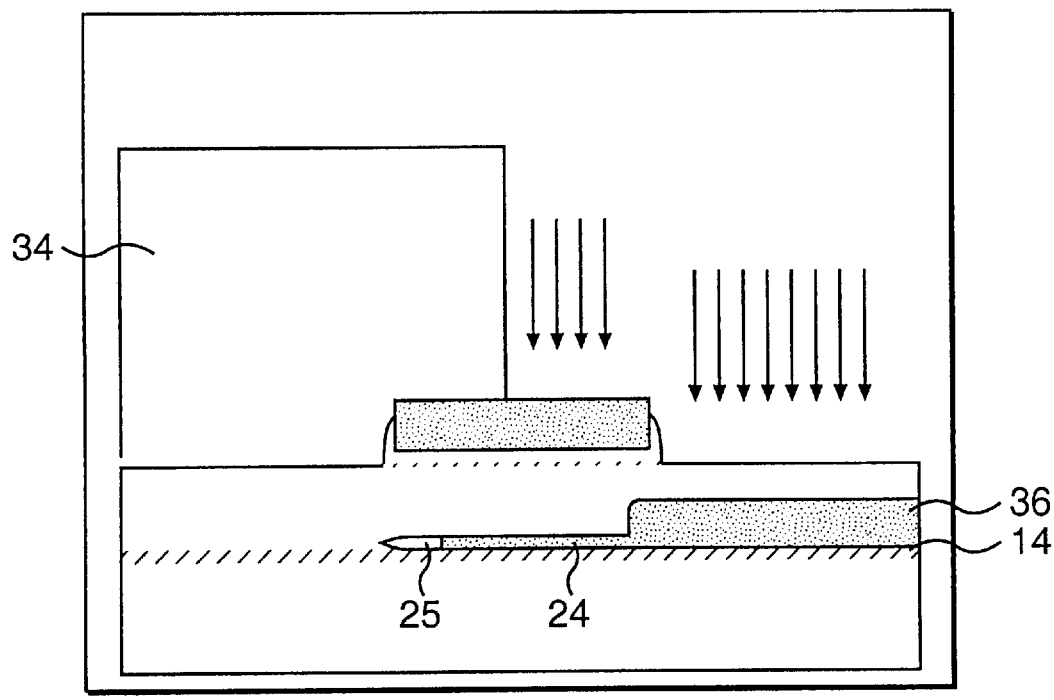
Figure 6:
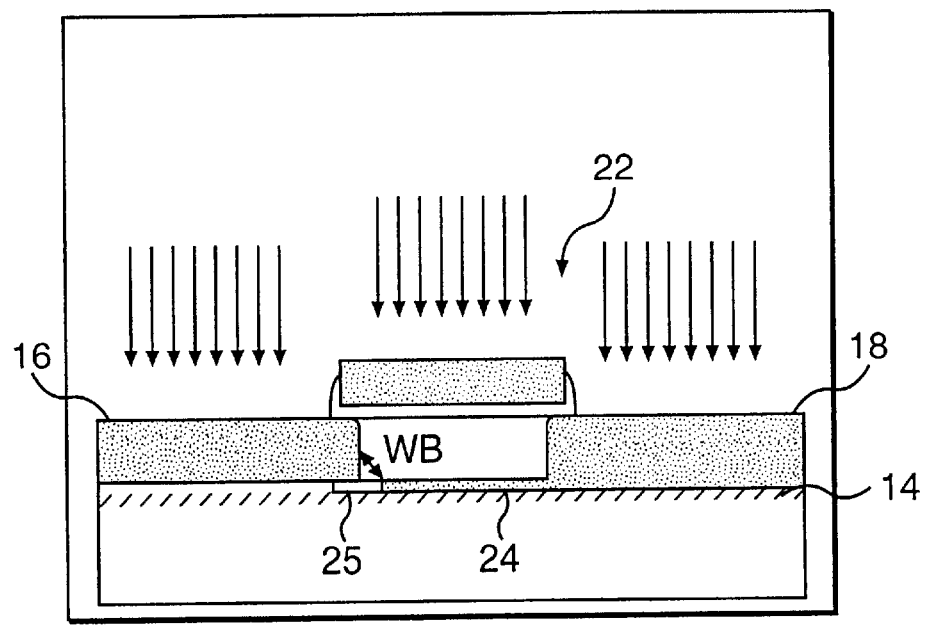

Turning now to FIG. 5, a mask 34 is formed over the semiconductor material on one side of the gate structure 22, in this case on the side which will become the source/emitter. The mask 34 should also preferably cover at least a portion of the gate conductor 32. A reach through implant 36 is then formed on the exposed side of the gate conductor, in this case what will be the drain side of the device. The reach through implant 36 is of the same conductivity type as the foot implant 24 and should contact the foot 24. As shown in FIG. 5, the reach through implant 36 should be formed at a distance below the surface of the semiconductor material 12 and should extend under the gate structure 22. The reach through implant 36 will be used to connect the drain region with the foot 24 and should be formed with this in mind. The mask 34 is removed and source/emitter 16 and drain 18 regions are implanted on either side of the gate structure 22, as shown in FIG. 6. The source/emitter 16 and drain 18 regions are preferably formed shallower than the depth of the semiconductor material 12 so that the source/emitter 16 and drain 18 regions are not implanted to the back interface of the semiconductor material 12. However, the depth of the implantation is sufficient so that the drain region 18 contacts and merges with the reach through implant 36. A gap maintained between the source/emitter region and the insulating region is preferably about 10–50 nm.

Figure 7:
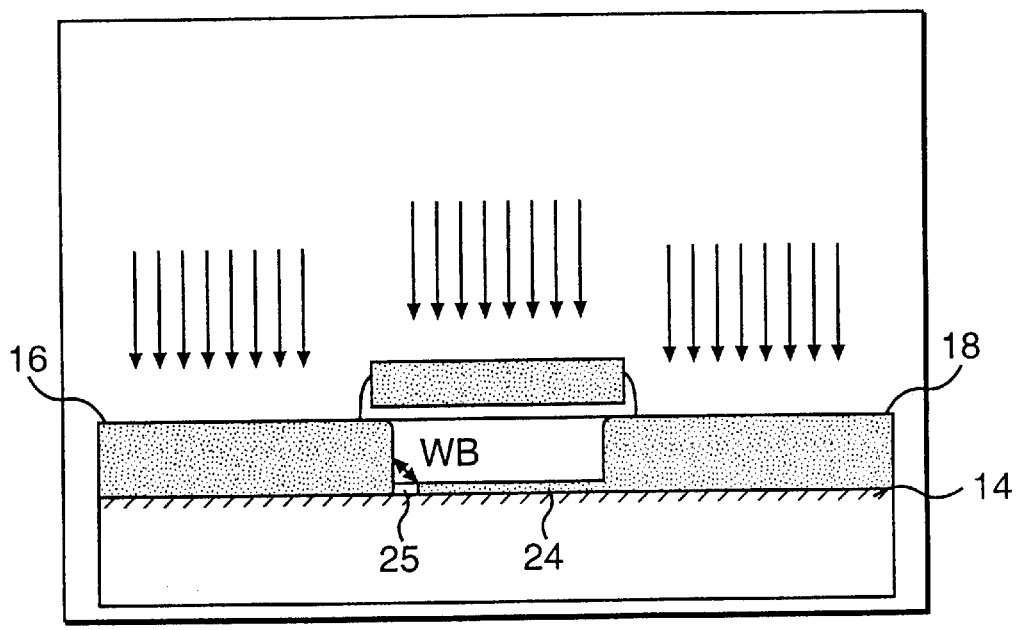

Alternatively, the source/emitter 16 and drain 18 regions may be implanted into the semiconductor material 12 to reach the insulating layer 14 as shown in FIG. 7. However, a gap is still maintained between the foot implant 24 and the source/emitter 16 region due to the presence of the sidewall spacer 30A of FIG. 3 which pushes the foot implant back from the source region/emitter 16.

It should be noted that the implanting of the reach through implant and of the source/drain regions preferably occurs for all the CMOS devices. Thus, the gate conductors, which are typically polysilicon, are also implanted with impurities as shown in FIGS. 5 and 6. This implantation enables the gate conductor to be used in the CMOS devices.

The above processes describe various methods for forming a combined FET/bipolar device in which the base width can be controlled using diffusion strategies. It is also possible to include processes for controlling the threshold voltage of the FET in the above-described processes. Additionally, the sequence in which the above processes are incorporated with standard device formation steps should be considered. Two options doing so are described below.

In a first option, a gate sacrificial oxide and well implants could be incorporated prior to forming the sidewall spacers used for forming the foot. The sidewall spacers for the foot would then terminate on the gate sacrificial oxide layer instead of the semiconductor material. The gate sacrificial oxide layer acts as a screening layer for the foot implant and subsequent diffusion of the foot caused by the oxidation process would be eliminated. In regions where a combined FET/bipolar device is not desired, it is important to consider the masking sequence. A possible processes described below. The following description includes some standard processing steps which are not described in detail. The gate sacrificial oxide is grown over the FET regions in all devices. Photoresist is then applied over the surface of the device and NFET and PFET wells are implanted. The process for forming the sidewall spacers for the foot implant is then carried out as described above with reference to FIGS. 3A–3C. Next, those FET's (and, in this instance, all PFET's) which are not to become combined FET/bipolar devices, are then covered. The foot implant is then implanted as shown in FIG. 3D and the process would continue as described above.

Figure 8:
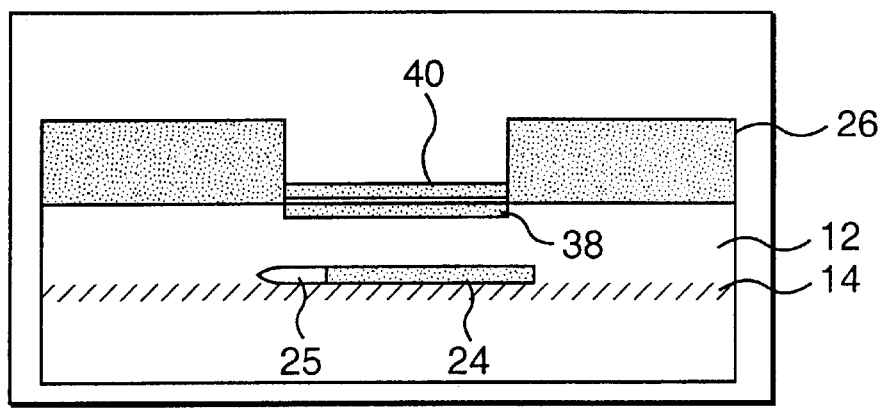
FIG. 8 illustrates a cross section of a semiconductor device formed according to a one embodiment of the present invention.

According to another option, a low temperature epitaxial silicon can be grown over the gate region to precisely set the threshold voltage of the FET. In this case, the halo is centered deep below the surface. It is preferable to carry out this step after the halo and the foot have been implanted. Again, in regions where the combined FET/bipolar device is not desired, it is important to consider the masking sequence. The following process assumes thick and thin SOI complementary device types and includes standard processing which is not described in detail. A gate sacrificial oxide is grown over the thin PFET and NFET regions. A photoresist is used to cover the device and subsequently all thin NFET and PFET wells are implanted. The sidewall spacers for the foot implant are then formed on the thick devices, as described above with reference to FIGS. 3A–3C, while the thin devices are masked. The foot implant 24 is then formed, the sidewall spacer stripped, and the halo implant 25 performed as shown in FIGS. 3D and 3E. Then, after a threshold tailor implant to form region 38 and gate sacrificial aside removal the low temperature expitaxial silicon layer 40 is grown resulting in the structure shown in FIG. 8. The remaining process steps described above may then be performed on the structure of FIG. 8.

Figure 9:
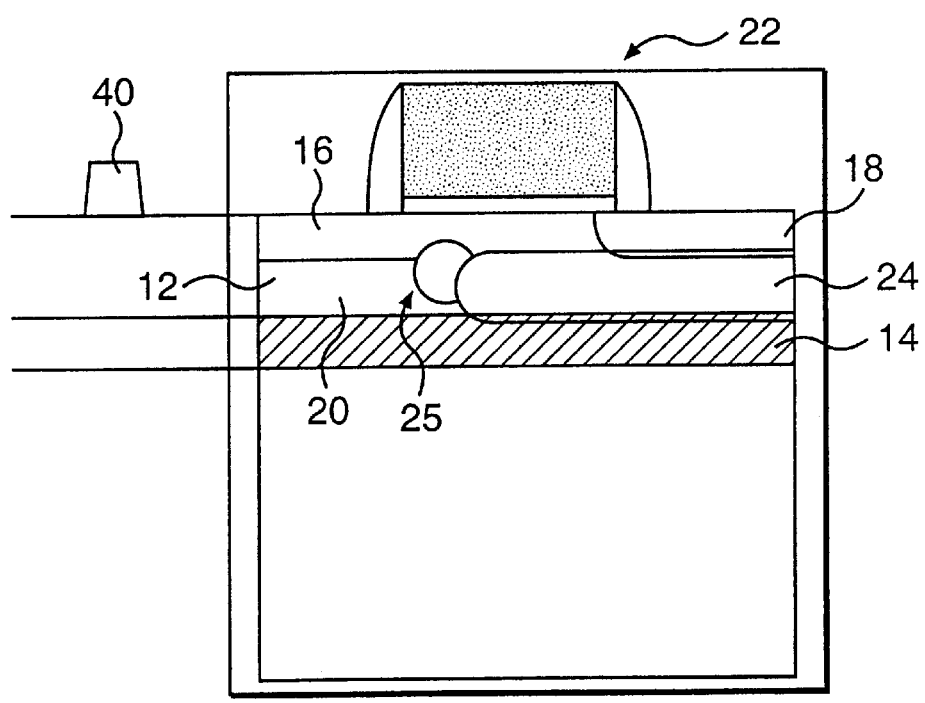
FIG. 9 illustrates a cross section of a semiconductor device formed according to a first method of the present invention.

A combined FET/bipolar device formed according to a method of the present invention is shown in FIG. 9. A gate structure 22 is formed on a top surface of the semiconductor layer 12. A source/emitter region 16 is formed in the semiconductor material 12 on one side of the gate structure 22 and the drain region 18 is formed in the semiconductor region 12 on an opposite side of the gate conductor 22. Both the source/emitter region 16 and the drain region 18 preferably extend under the gate structure 22. A body region 20 is defined in the semiconductor material between the source/emitter region 16 and the drain region 18 and underneath the gate structure 22. A collector region 24, i.e. the foot implant, is formed contacting and extending from the drain region 18 under the gate structure 22. The connection between the foot 24 and the drain region 18 may be facilitated, in this embodiment, by reach through implant 36. The collector region 24 is preferably formed adjacent to the insulating layer 14 and under the body region 20. The distance between the source/emitter region 16 and the collector 24 defines the base width Wb. The base width Wb is determined during the formation of the device by the width of the sidewall spacer 30A. The foot 24 is implanted through the gate region 28 using the spacer 30A as a part of the mask. The source/emitter 16 is implanted using the gate structure 22, formed in the gate region 28, as a mask. The spacer 30A determines the distance between the foot 24 and the source/emitter 16. The wider the sidewall spacer 30A, the wider the resulting base width will be.

Figure 10:
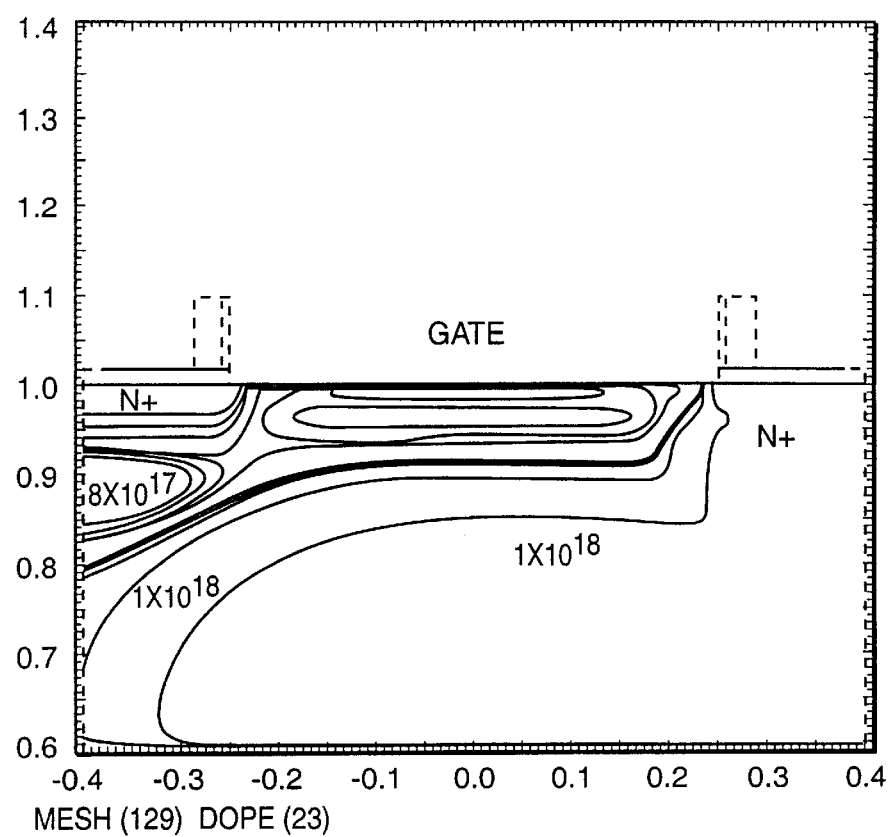
FIG. 10 illustrates doping contours of a structure fabricated according to a first method of the present invention.

The source/emitter region 16 is preferably formed so that a gap is maintained between it and the insulating layer 14. This allows the base region 20 to extend under the source/emitter region 16 to an area of the semiconductor material on a side of the source/emitter region 16 opposite the gate structure 22. In this area, a base contact 40 may be formed. Alternatively, if the source/emitter region 16 and the drain region 18 are both formed to contact the insulating layer 14, as shown in FIG. 7, for example, the base contact 40 would be formed in an area extending perpendicular from the surface of the page. FIG. 10 illustrates an example of some modeled doping contours and doping concentrations for the embodiment of FIG. 9.

Figure 11:
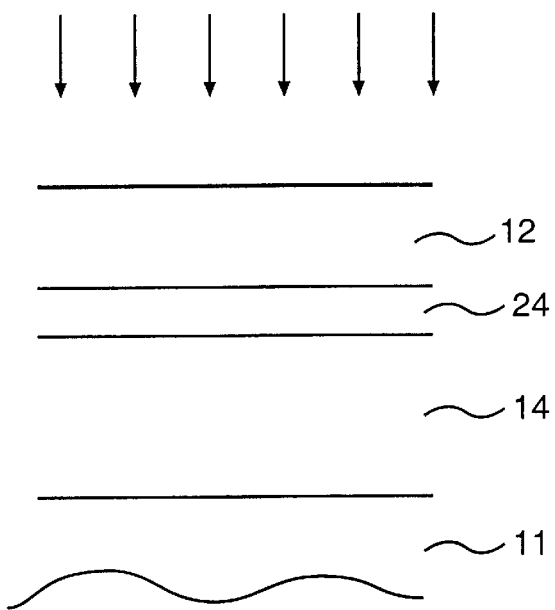
FIGS. 11–14 illustrate a method according to another embodiment of the present invention.
Figure 12:
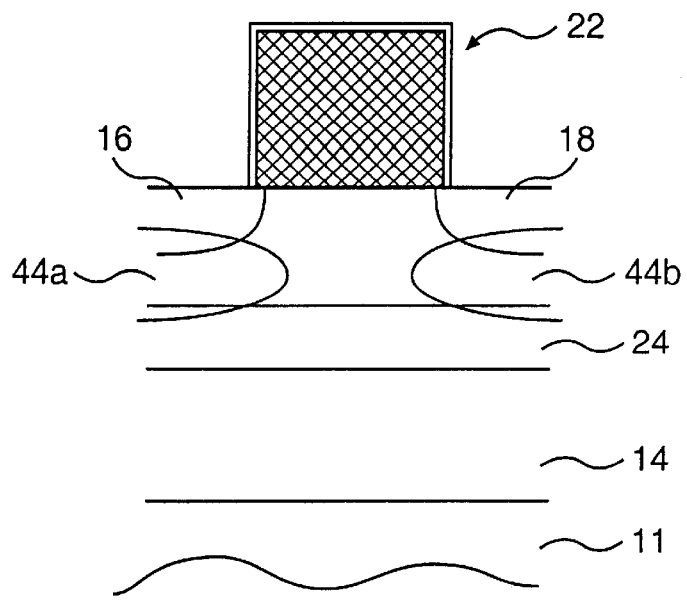

Turning now to FIGS. 11–14, a process for forming a combined FET/bipolar device according to another embodiment of the present invention will be described. The same reference numbers used above in describing the invention with reference to the figures are used here for similar structure. An SOI substrate is provided. A collector 24 is implanted into the semiconductor material 12, preferably through a screen oxide layer. The collector implant 24 may be an n-type impurity, for example, antimony, which has a low diffusivity and a small implant straggle so that the implant may be confined near the back interface of the semiconductor material 12. In this instance, an SOI layer having a thickness of approximately 400 nm is used with an antimony implant of about $1 \times 10^{16}$ cm$^{-2}$ at approximately 1 MeV This results in a buried collector centered at approximately the back interface of the semiconductor material having a peak concentration of approximately $3 \times 10^{19}$ cm$^{-3}$. The resulting structure is shown in FIG. 11. Next, conventional semiconductor processing techniques, such as stripping the sacrificial oxide, growing a gate insulator, forming a gate stack, and forming source/drain implants, may be performed using well-known procedures. Following that, as shown in FIG. 12, halos 44a and 44b having conductivity types opposite that of the collector 24 are formed under the source 16 and rain 18 diffusion regions. This is different from the embodiment first described where the halo is formed in the body of the PET. The halo implants 44a and 44b are preferably implanted using the same mask used for forming the source/drain regions. As the gate conductor is preferably used as a mask for implanting the halos 44a and 44b, the halos 44a and 44b should not extend far into the body region 22 located between the source 16 and drain 18 diffusion regions.

Figure 13:
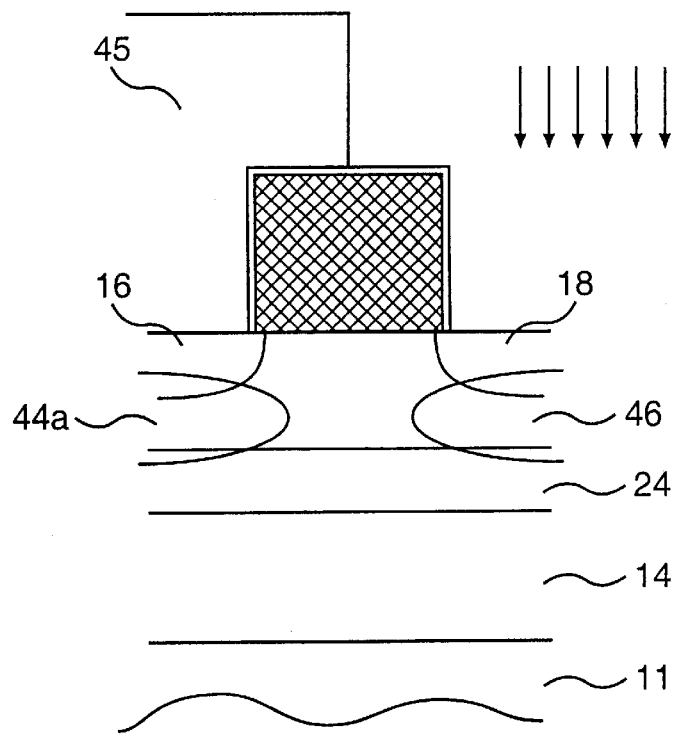

Next, a reach through implant 46 is made on one side of the device, here the drain side, to connect the drain diffusion 18 with the collector 24. The reach through implant 46 should be of the same conductivity type as the drain 18 and collector 24 and is performed having a doping concentration to overcompensate the previously implanted halo 44b. As shown in FIG. 13, a resist 45 is formed over the source side of the device as well as a portion of the gate structure 22. The reach through implant 46 of an n-type impurity is then made. Note that as the reach through implant 46 is formed into the drain 18, a portion of the gate electrode is exposed. This provides an opportunity to place additional doping into the gate electrode. This, in turn, will optimally allow the entire gate electrode to be doped as the diffusivity of polysilicon is much greater than that of silicon. Consequently, the reach through implant will homogeneously diffuse throughout the gate. As a result, gate depletion is reduced and a higher performance MOSFET/BiPolar device is achieved.

Figure 14:
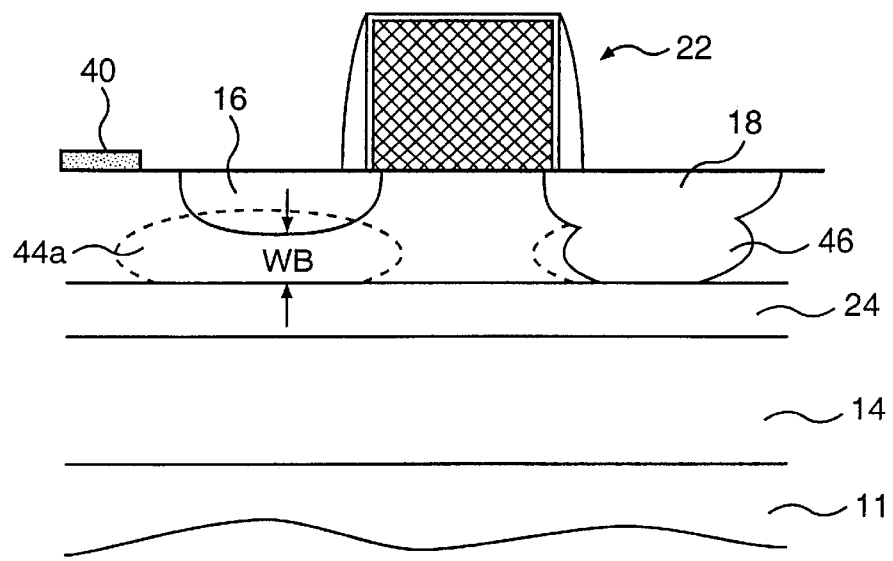

Next, the resist 45 is stripped and a base contact may be formed on a surface of the semiconductor layer on a side of the source region opposite the gate structure 22, resulting in the structure shown in FIG. 14. The collector implant 24 of the structure illustrated in FIG. 14 extends under both the source 16 and drain 18 diffusion regions. This differs from the embodiment of FIG. 9 where the collector (foot) extends under the gate, but not under source 16. As a result, the shortest distance between the collector and the source in FIG. 14 is in a vertical direction, opposed to a diagonal direction as in FIG. 9. Thus, in FIG. 14, a vertical npn bipolar transistor in the true sense has been formed with the shortest distance between the source/emitter and the collector defining the base width. The base width Wb may be controlled in this embodiment by varying the thickness of the source/emitter and collector regions.

Each of the structures shown in FIGS. 9 and 14 operates in a similar manner and possesses novel electrical characteristics. In particular, a dynamic pinch off effect occurs which lowers the snap back voltage of the FET. As the drain voltage increases, the depleted portion of the base under the source/emitter expands, pinching off the base Wb, and the base-body resistance of the region between the bottom of the source diffusion and the insulating layer increases. With increasing drain voltage, it becomes increasingly difficult for the body of the FET to exchange charge with the body contact. Here the FET body is defined as the area bounded by the FET source, drain and foot regions, and vertically isolated by the oxide layer. At higher drain voltages, the body of the FET, for all practical purposes, is floating, i.e., the base is fully pinched off. As the drain impact ionization current increases with increasing drain voltage, the charge in the body increases and, thus, the potential of the body with respect to the source also increases. With the lowered source to body potential barrier, the flow of electrons emitted from the source increases, which also increases the impact ionization rate. This positive feedback mechanism results in a significant reduction in snap back voltage relative to the snap back voltage in conventional FET's with comparable channel and source/drain doping profiles. For example, conventional FET's having doping profiles comparative to the simulated device described below snap back in excess of 6.5 volts with $V_g = 0$. The device shown in FIG. 14 above is predicted to snap back at approximately 3.5 volts. Thus, the dynamic pinch off effect of the body is predicted to reduce snap back voltage by at least 3 volts.

Figure 15:
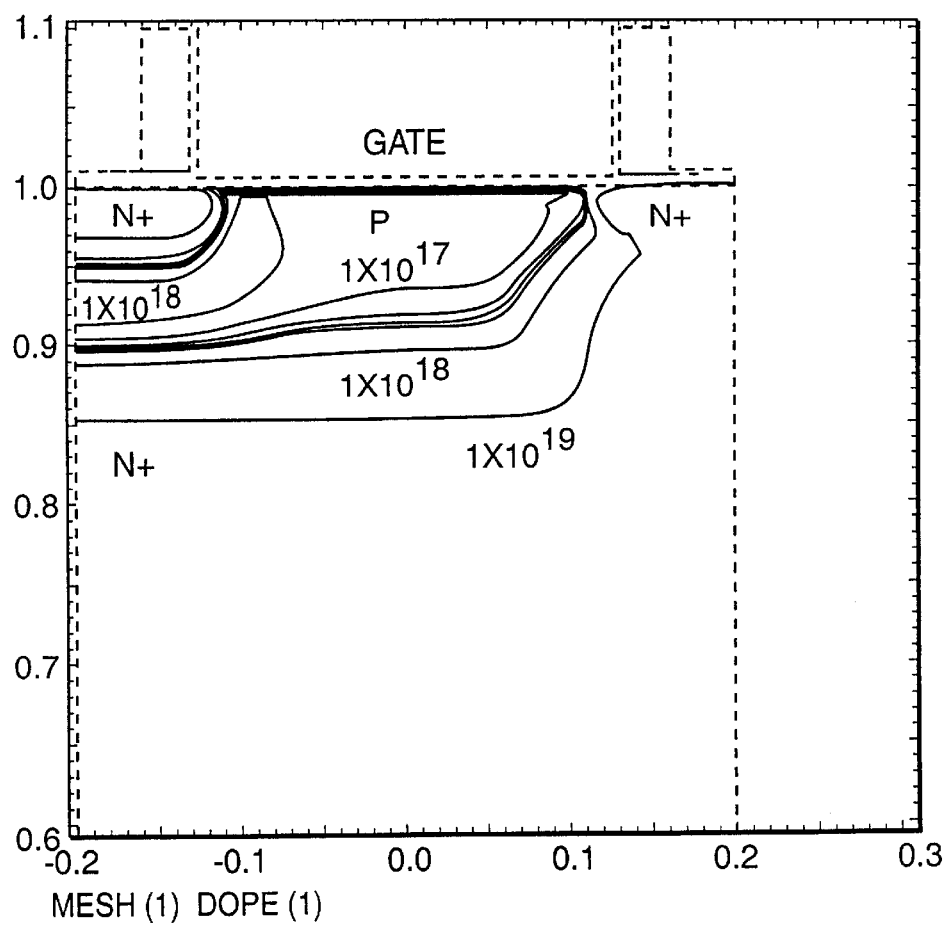
FIG. 15 illustrates the dopant distribution for the semiconductor device of FIG. 14.
Figure 16:
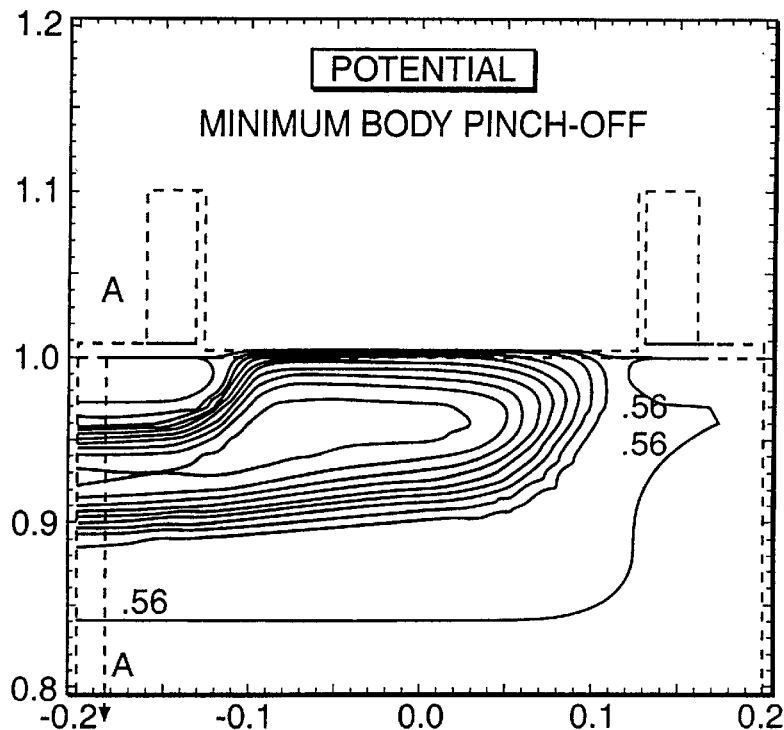
FIGS. 16 and 17 illustrate potential contours for the device of FIG. 14.

FIG. 15 illustrates a possible doping contour for the structure of FIG. 14, and FIG. 16 illustrates potential contours for the structure of FIG. 14, with $V_d = 0$. As shown in FIG. 16, the drain depletion region does not penetrate into the base and the potential barrier between source and base is greater than 0.9 volts. This drain bias results in minimum depletion of holes from under the source diffusion region. Since, for this bias condition, the holes are essentially undepleted from under the source, a low resistance path, towards the left of the FIG. 16, for equilibrium of the body charge exists. Now in FIG. 17, potential contours of the same device are shown for a drain voltage of 2.5 volts. In this bias condition, the drain has swept the holes from the base region and the path from the body has a high resistance that is, the dynamic effect of pinching off the base (i.e., isolating the MOSFET body) causes the body resistance to increase. Thus, any holes accumulated in the body due to generation mechanism, such as impact ionization, remain in the body for an extended period of time after the generation mechanism is turned off, e.g., the drain voltage is reduced. Therefore, once the device snaps back, it remains latched to a very low sustaining voltage.

Figure 17:
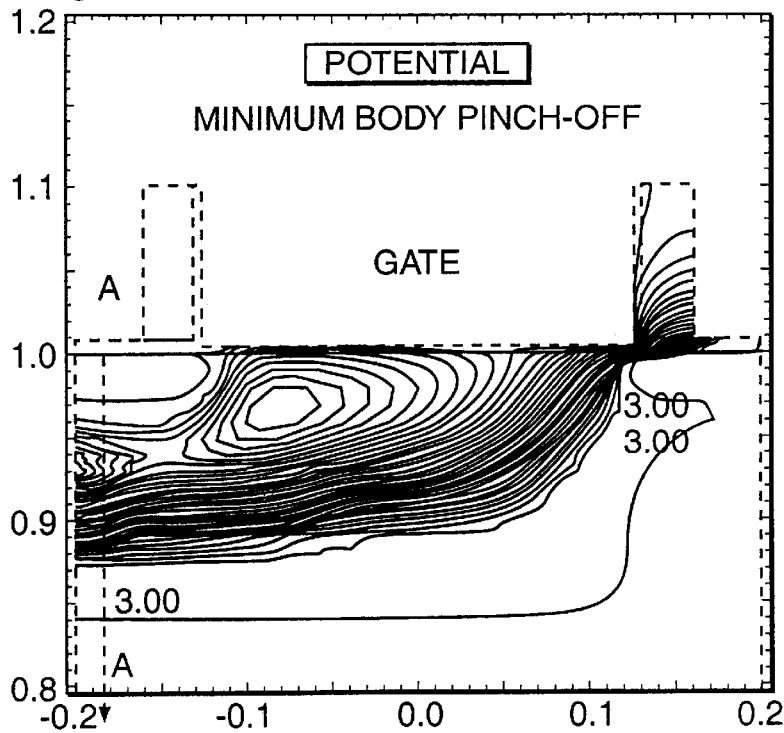
Figure 18:
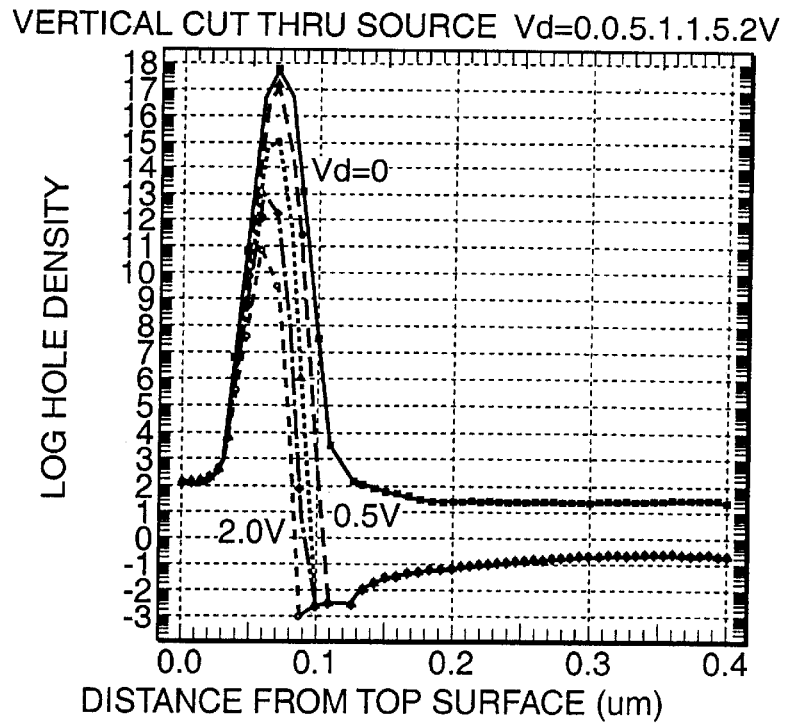
FIG. 18 is a line plot of holes taken through the line A—A of FIGS. 16 and 17.

FIG. 18 illustrates line plots of hole concentration along a line A—A of FIGS. 16 and 17, with drain voltage as a parameter. Note that the peak hole concentration under the source drops by approximately 5 orders of magnitude when the drain voltage is increased from 0 to 1.5 volts. When the drain voltage equals 1.5 volts, the region under the source is nearly depleted of holes and the body is rendered floating. The base width Wb is thus controlled by the voltage on the drain. As this voltage increases, a depletion region extends from the collector dynamically reducing, or pinching, the base width Wb.

Figure 19:
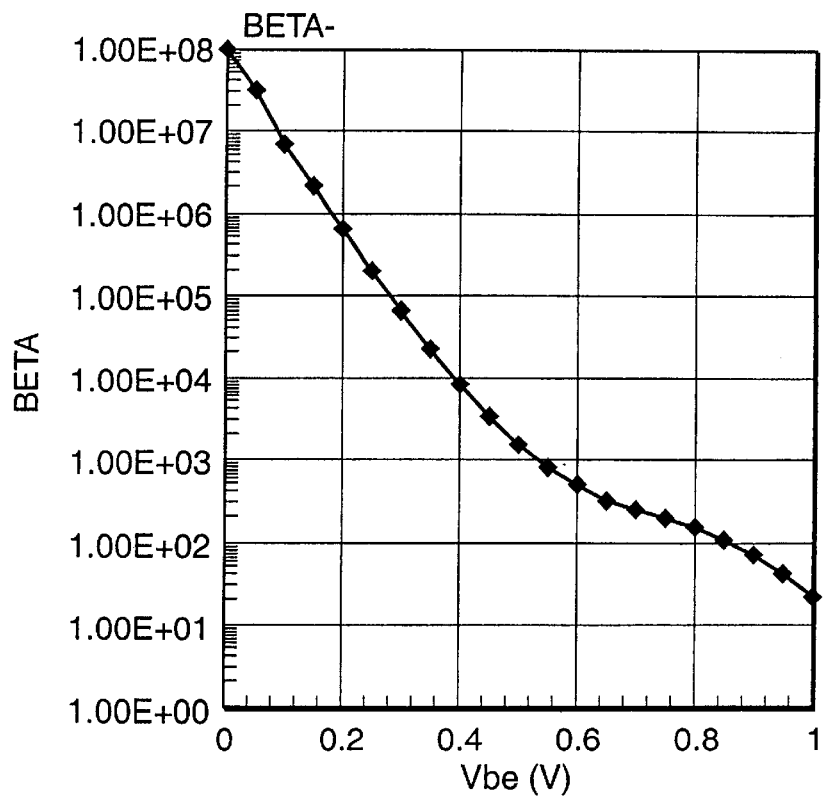
FIG. 19 is a plot of beta versus Vbe a device formed according to a first method of the present invention.

Accordingly, a multi-function semiconductor structure and method of forming the same has been provided. The structure includes a bipolar transistor and an FET in parallel. The bipolar transistor and the FET may be used either separately or both simultaneously. Additionally, the device of the present invention possesses novel electrical characteristics. In particular, a dynamic pinch off effect occurs which lowers the snap back voltage of the FET. Furthermore, the bipolar device has a very large effective beta. The effective beta is developed during the base voltage modulation of the MOSFET body, which enhances the observed bipolar speed. FIG. 19 is a plot of the beta versus Vbe for the first described embodiment. From the plot it can be seen that the device has excellent electrical characteristics.

While a preferred embodiment of the invention has been described above, since variations in the invention will be apparent to those skilled in the art, the invention should not be construed as limited to the specific embodiments described above. For example, the doping concentrations and dopants may differ from those described above.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of forming a semiconductor device comprising:
   a) providing a semiconductor material on an insulator;
   b) defining a gate region in which a gate structure will be subsequently formed on the semiconductor material with a mask;
   c) forming first and second spacers on sidewalls of the mask;
   d) removing a first one of the spacers without removing a second one of the spacers;
   e) implanting a foot of a first conductivity type into the semiconductor material through the gate region;
   f) removing a second one of the spacers; and
   g) implanting a halo of a second conductivity type, which is an opposite conductivity as the first conductivity type, into the semiconductor material through the gate region, wherein the halo is formed adjacent to the foot implant.

2. The method according to claim 1 further comprising:
   forming a gate structure in the gate region;
   removing the mask;
   covering a source/emitter side of the device and a portion of the gate structure;
   implanting a dopant of the first conductivity type into exposed parts of the device forming a reach through region contacting the foot implant;
   uncovering the source/emitter side; and
   implanting impurities to form source/emitter and drain regions which extend under the gate structure.

3. The method of claim 1 further comprising:
   growing a sacrificial oxide over the semiconductor material and implanting Nfet and Pfet wells before step c); and
   covering those Nfet and Pfet which are not to become combined devices before step e).

4. The method of claim 1 further comprising:
   growing a sacrificial oxide over thin Nfet and Pfet regions of the semiconductor material, implanting Nfet and Pfet wells and masking the thin Nfet and Pfet wells before step c); and
   growing an epitaxial layer in the gate region following removal of the sacrificial oxide after step g).

5. The method of claim 1 wherein peak of the foot is formed at an interface between the semiconductor layer and the insulating layer.

6. The method of claim 1 wherein the source/emitter region and the drain region reach the insulating layer.

7. The method of claim 1 wherein the reach through region is formed at a distance from a surface of the semiconductor material.

8. The method of claim 2 wherein a portion of the gate structure is uncovered with the source/emitter side and subsequently implanted with the impurities.

9. A method of forming a combined FET/bipolar semiconductor device comprising:
   providing a semiconductor material on an insulating layer;
   forming a collector region in the semiconductor material adjacent to the insulating layer;
   forming a gate structure on the semiconductor material;
   forming source/emitter and drain regions in the semiconductor material on opposite sides of the gate structure;
   implanting a halo of an opposite conductivity type of the collector between the source/emitter region and the collector and between the drain region and the collector;
   implanting a reach through implant of the same conductivity type as the collector on the drain side of the gate to counter dope the halo on that side and connect the drain and the collector.

10. The method of claim 9 wherein the source/emitter region and drain region are both formed over the collector region.

11. The method of claim 9 further comprising forming a base contact on a surface of the semiconductor material on a side of the source/emitter region opposite the gate stack.

12. The method of claim 9 wherein the source/emitter region and the drain region extend under the gate stack.

* * * * *